US006159844A

United States Patent [19]

Bothra

[11] Patent Number: 6,159,844

[45] Date of Patent: Dec. 12, 2000

[54] FABRICATION OF GATE AND DIFFUSION CONTACTS IN SELF-ALIGNED CONTACT PROCESS

[75] Inventor: Subhas Bothra, San Jose, Calif.

[73] Assignee: Philips Electronics North America Corp., New York, N.Y.

[21] Appl. No.: 09/087,492

[22] Filed: May 29, 1998

[51] Int. Cl.[7] ..... H01L 21/4763

[52] U.S. Cl. ..... 438/637; 438/233; 438/634; 438/702

[58] Field of Search ..... 438/597, 624, 438/619, 253, 238, 637, 233, 634, 702; 478/241

[56] References Cited

U.S. PATENT DOCUMENTS

| | | | |
|---|---|---|---|
| 3,792,319 | 2/1974 | Tsang | 317/235 R |
| 4,042,950 | 8/1977 | Price | 357/51 |
| 4,966,870 | 10/1990 | Barber et al. | 437/228 |
| 5,397,722 | 3/1995 | Bashir et al. | 437/41 |
| 5,413,969 | 5/1995 | Huang | 437/200 |
| 5,468,342 | 11/1995 | Nulty et al. | 156/643.1 |
| 5,547,881 | 8/1996 | Wang et al. | 437/24 |
| 5,578,523 | 11/1996 | Fiordalice et al. | 437/190 |
| 5,605,854 | 2/1997 | Yoo | 437/44 |
| 6,080,661 | 6/2000 | Bothra | 438/637 |

OTHER PUBLICATIONS

Unknown, "Advanced Interconnection and Contact Schemes Based on $TiSi_2$ and $CoSi_2$ : Relevant Materials Issues and Technological Implementation", Jun. 1988, pp. 144–153, Imec, Katholieke Universiteit Leuven.

*Primary Examiner*—Mahshid Saasat
*Assistant Examiner*—José R. Diáz
*Attorney, Agent, or Firm*—Martine Penilla & Kim, LLP

[57] ABSTRACT

Disclosed is a method for fabricating conductive contacts in a dielectric layer that overlies a semiconductor wafer having diffusion regions, shallow trench isolation regions, and gate structures that have a part overlying the shallow trench isolation regions. The method includes forming an oxide layer over the gate structures and forming a photoresist mask over the semiconductor wafer, including the oxide layer over the gate structures. The photoresist mask has windows that define an opening over gate contact locations, and the gate contact locations are defined substantially over the part of the gate structures that overlie the shallow trench isolation regions. The method further includes etching the oxide layer over the gate structures through the windows to define exposed gate structure regions. The method also includes depositing a silicon nitride layer over the semiconductor wafer including the oxide layer over the gate structures and the exposed gate structure regions, and depositing a dielectric layer over the deposited silicon nitride layer. The method then includes etching via holes through the dielectric layer and the silicon nitride layer to define conductive contact vias to both the exposed gate structure regions and diffusion regions.

26 Claims, 9 Drawing Sheets

Dielectric Etch 212 210 209 212 210 210 208a 208b 204a 206a 206b 204b

Silicon Nitride Etch 218 218 218 213a 211 216 216 216 210 214 208a 208b 204a 206a 206b 204b 200

FABRICATION OF GATE AND DIFFUSION CONTACTS IN SELF-ALIGNED CONTACT PROCESS

CROSS REFERENCE TO RELATED APPLICATIONS

This application is related to U.S. Pat. No. 6,080,661 entitled "Methods for Fabricating Gate and Diffusion Contacts in Self-Aligned Contact Processes," having U.S. Ser. No. 09/087,441, filed on the same day as the instant application. This application is hereby incorporated by reference.

BACKGROUND OF THE INVENTION

1. Field of the Invention

The present relates to the manufacture of semiconductor devices. More particularly, the present invention relates to techniques for improving the fabrication of conductive contacts to gate electrodes and diffusion regions in high performance devices.

2. Description of the Related Art

In fabricating semiconductor devices, semiconductor wafers are placed through a multitude of fabrication operations in order to produce a desired integrated circuit device. As integrated circuit devices continue to shrink, design engineers are continually required to push the limit on existing fabrication techniques. By way of example, when transistor devices are designed with smaller and smaller drain and source diffusion regions, the conductive contacts (i.e., defined through silicon dioxide) that are designed to make electrical links with selected diffusion regions sometimes experience misalignments. Because standard photolithography techniques are now being pushed to their physical limits, these misalignments are expected. Therefore, in order to avoid making an unwanted electrical contact with a gate electrode when a misalignment occurs, a self-aligned contact (SAC) fabrication process has now become common practice. For ease of description, a conventional SAC fabrication process is discussed with reference to FIGS. 1A–1E.

FIG. 1A shows a cross sectional view 100 of a semiconductor substrate 102 having several fabricated layers illustrating a exemplary self-aligned contact (SAC) in accordance with a conventional semiconductor fabrication technique. In this example, the semiconductor substrate 102 has two shallow trench isolation regions (STI) 104*a* and 104*b*, which are conventionally used to isolate the various semiconductor transistor devices fabricated throughout a semiconductor wafer. Also shown are two transistor devices having polysilicon gates 108*a* and 108*b*. The transistor device having polysilicon gate 108*a* is shown having diffusion regions 106*a* and 106*b* which are used to define the source and drain regions of the transistor device. The transistor device having polysilicon gate 108*b* is shown partially lying over the shallow trench isolation region 104*b*, which is better defined by a cross section A—A of FIG. 1B.

As shown in a top view of FIG. 1B, the polysilicon gate 108*b* has a contact region in which a contact 109*b* may be made to the polysilicon gate 108*b* (i.e., over a poly head). However, the contact 109*a* is a self-aligned contact (SAC) which enables the formation of a via hole down to the diffusion region 106*b* without exposing the polysilicon gate 108*a*. In this example, contact 109*a* is shown misaligned because the design rules of smaller devices typically causes such misalignments. In contrast, older generation devices had larger geometric sizes, and therefore, the via holes down to the diffusion regions usually did not accidentally misalign over the polysilicon gates and cause circuit malfunctions.

Referring back to FIG. 1A, the polysilicon gates 108*a* and 108*b* have an oxide layer 110 defined along the sidewalls and the top surfaces of the polysilicon gates 108. The oxide that remains along the sidewalls of the polysilicon gates 108*a* and 108*b* are commonly referred to as oxide spacers. Once the oxide material 110 has been defined, a silicon nitride layer 112 is formed over the semiconductor substrate including over the oxide material 110. Also shown is a dielectric layer 114 that is defined over the silicon nitride layer 112. In order to define the via holes through the dielectric layer 114, a photoresist mask 116 (having expected misalignments) is used to identify the locations where contact 109*a* and 109*b* will ultimately reside. After the photoresist mask 116 has been defined, a dielectric etch operation is performed which selectively removes the exposed dielectric material 114 and stops at the silicon nitride layer 112. At this point, a second etching operation is performed (using a different etch chemistry) to etch through the silicon nitride layer 112 as shown in FIG. 1C.

This silicon nitride etch will continue until the exposed silicon nitride layer 112 is removed from within the via holes that define the contact locations 109*a* and 109*b*. As shown, the silicon nitride layer will be removed until the oxide material 110 and diffusion region 106*b* is exposed within the via holes. At this point, a clear path will be made down through the via hole of contact 109*a*, which defines a path down to the diffusion region 106*b* (without exposing the polysilicon gate 108*a*). However, electrical contact is also desired down to the polysilicon gate 108*b* through the via hole that defines the contact 109*b*.

To accomplish this, a typical prior art approach, shown in FIG. 1D has been to spin-coat a new photoresist layer 116' over the semiconductor substrate, which substantially fills the via holes that define paths to the contacts 109*a* and 109*b*. The photoresist layer 116' is then patterned using a conventional photolithography process which is configured to make the photoresist layer 116' lying over the contact 109*b* more soluble during a subsequent photoresist development operation (in some cases, photoresist may also become trapped within the via hole of contact 109*b*). When the photoresist material 116' mask is complete and ready for etching, the via hole of the contact 109*a* will remain filled with photoresist. Next, a dielectric etch is performed to remove the oxide material 110 that remains over the polysilicon gate 108*b*, which will enable subsequent electrical contact to be made when a conductive via is formed in the via hole of contact 109*b*. Once the dielectric etch is complete and the oxide material 110 is removed from over the polysilicon gate 108*b*, the photoresist material 116' is stripped.

Unfortunately, because some via holes such as those of contact 109*a* are sometimes quite deep (i.e., have large aspect ratios), conventional photoresist stripping operations may inadequately remove all of the photoresist material from within the via holes. As shown in FIG. 1E, a residue of photoresist material 116' remains at the bottom corners (and sometimes over the entire bottom surface) of the via hole of the contact 109*a*. Hence, the tungsten plugs 118*a* and 118*b* defined in the via holes of the contacts 109*a* and 109*b* will necessarily suffer by exhibiting high contact resistances and reduced reliability. Furthermore, as demands for smaller integrated circuit devices continue to increase, the contact via holes will exhibit larger aspect ratios which will necessarily make it more likely that photoresist residues will be trapped within via holes. As a result, the conductive contacts throughout an integrated circuit design will exhibit higher resistances that will prevent the device from operating at higher speeds.

In attempts to combat the problem of trapped photoresist residue in via holes, fabrication engineers have been forming the contacts that are made down to the drains and sources, and the polysilicon gates during different fabrication cycles. For example, after the dielectric layer 114 is deposited over the semiconductor substrate 102, only via holes down to the source and drain diffusion regions are made. As mentioned above, the process of making an electrical contact down to the diffusion regions requires utilizing two separate etching operations in order to first etch through the dielectric layer 114 and then through the silicon nitride layer 112. Once those etching operations are complete, the tungsten plugs 118*a* are formed, and a CMP operation or a tungsten etch-back operation is used to remove the excess tungsten material after filling the contacts down to the diffusion regions.

Once the formation of all of the contacts down to the sources and drains is complete for a particular integrated circuit device, via holes are then defined down to the polysilicon gates 108*b*. To define this via hole, three separate etching operations are utilized in order to etch though the dielectric layer 114, the silicon nitride layer 112, and then the oxide material 110. Once the formation of these via holes is complete and a path is made down to the polysilicon gate 108*b*, tungsten plugs 118*b* are formed. After the tungsten deposition is complete, a CMP operation or tungsten etch-back is again performed in order to remove the excess tungsten material.

Although forming contacts to diffusion regions and gate electrodes during different process cycles may produce more reliable interconnect structures, the number of process operations performed to form all of the contacts is essentially doubled. Furthermore, when a semiconductor wafer is placed through more process operations, the previously formed layers are subjected to processing stresses and heat operations that may introduce reliability reducing side effects, and may therefore reduce yield.

In view of the foregoing, there is a need for methods that improve the fabrication efficiency of conductive contacts made to diffusion regions and transistor gate electrodes throughout a semiconductor integrated circuit device.

SUMMARY OF THE INVENTION

Broadly speaking, the present invention fills these needs by providing improved methods for fabricating conductive contacts down to diffusion regions and transistor gates in self-aligned contact processes. It should be appreciated that the present invention can be implemented in numerous ways, including as a process, an apparatus, a system, a device, or a method. Several inventive embodiments of the present invention are described below.

In one embodiment, a method for manufacturing reliable conductive contacts in semiconductor devices fabricated throughout a semiconductor wafer is disclosed. The semiconductor devices have a multiplicity of transistor devices, and each of the transistor devices have a pair of diffusion regions and a polysilicon gate structure. The method includes: (a) forming an oxide layer over a top surface and sidewalls of the polysilicon gate structure of each of the transistor devices; (b) forming a photoresist mask that exposes gate contact locations over the polysilicon gate structure of each of the transistor devices, such that the gate contact locations are defined over shallow trench isolation regions; (c) etching the oxide layer over the top surface of the polysilicon gate structure of each of the transistor devices, such that the etching removes the oxide layer that is exposed by the photoresist mask; (d) depositing a silicon nitride layer over the transistor devices that are defined throughout the semiconductor wafer; (e) depositing a dielectric layer over the silicon nitride layer; and (f) etching via holes through the dielectric layer and the silicon nitride layer for conductive contacts down to selected ones of the pair of diffusion regions and the polysilicon gate structure of selected transistor devices.

In another embodiment, a method for fabricating conductive contacts in a dielectric layer that overlies a semiconductor wafer having diffusion regions, shallow trench isolation regions, and gate structures that have a part overlying the shallow trench isolation regions is disclosed. The method includes forming an oxide layer over the gate structures and forming a photoresist mask over the semiconductor wafer, including the oxide layer over the gate structures. The photoresist mask has windows that define an opening over gate contact locations, and the gate contact locations are defined substantially over the part of the gate structures that overlie the shallow trench isolation regions. The method further includes etching the oxide layer over the gate structures through the windows to define exposed gate structure regions. The method also includes depositing a silicon nitride layer over the semiconductor wafer including the oxide layer over the gate structures and the exposed gate structure regions, and depositing a dielectric layer over the deposited silicon nitride layer. The method then includes etching via holes through the dielectric layer and the silicon nitride layer to define conductive contact vias to both the exposed gate structure regions and diffusion regions.

In yet another embodiment, a method of making an integrated circuit device having reliable conductive contacts formed in accordance with a self-aligned contact (SAC) process is disclosed. The integrated circuit device is fabricated from a semiconductor wafer that has diffusion regions, shallow trench isolation regions, and gate structures that have a part overlying the shallow trench isolation regions. The method includes: (a) forming an oxide layer over the gate structures; (b) forming a photoresist mask over the semiconductor wafer including the oxide layer over the gate structures, such that the photoresist mask has windows that define an opening over gate contact locations, and the gate contact locations are defined substantially over the part of the gate structures that overlie the shallow trench isolation regions: (c) etching the oxide layer over the gate structures through the windows to define exposed gate structure regions; (d) depositing layers over the semiconductor wafer including the oxide layer over the gate structures and the exposed gate structure regions; and (e) etching via holes through the layers to define conductive contact vias to both the exposed gate structure regions and diffusion regions. In a preferred embodiment, once the conductive contact vias are defined, all of the conductive contact vias to both the diffusion regions and the exposed gate structure regions can be simultaneously formed.

As an advantage, because the conductive vias to both diffusion regions and gate electrodes are made at about the same time, the prior art problem of photoresist trapping can be avoided, which necessarily produces more reliable conductive contacts. In addition, the need to fabricate conductive contacts separately for diffusion regions and then for gate electrodes is also eliminated, thereby reducing the cost of fabrication and also increasing yield. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for improved methods of fabricating conductive contacts down to diffusion regions and transistor gates in self-aligned contact processes is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
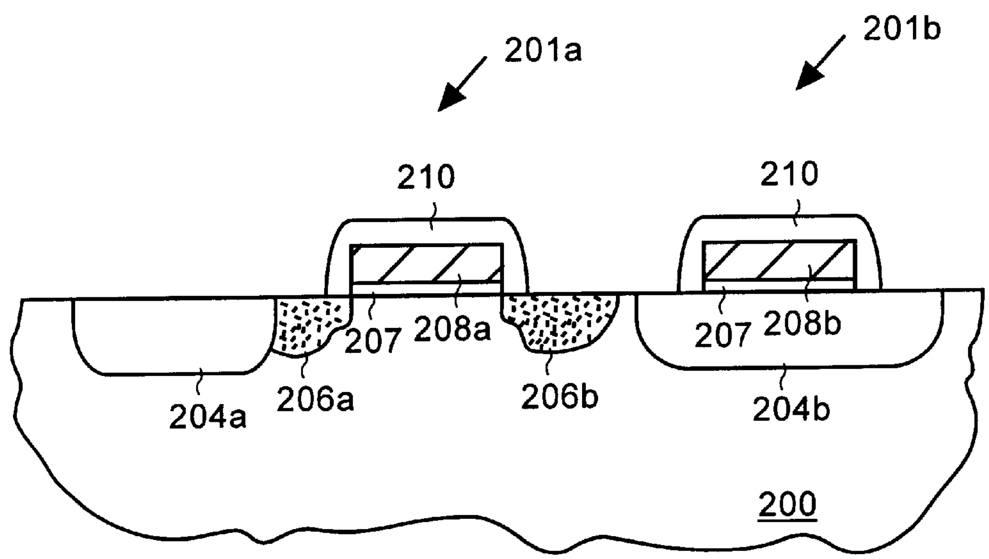
FIG. 2 shows a cross sectional view of a semiconductor substrate having two exemplary transistor structures fabricated thereon.

FIG. 2 shows a cross sectional view of a semiconductor substrate having two exemplary transistor structures 201*a* and 201*b* fabricated thereon. In this example, the semiconductor substrate has two shallow trench isolation (STI) regions 204*a* and 204*b* which are used to electrically isolate adjacent transistors, and similar STI structures are defined throughout a semiconductor substrate to isolate other respective transistor devices.

Figure 1A:
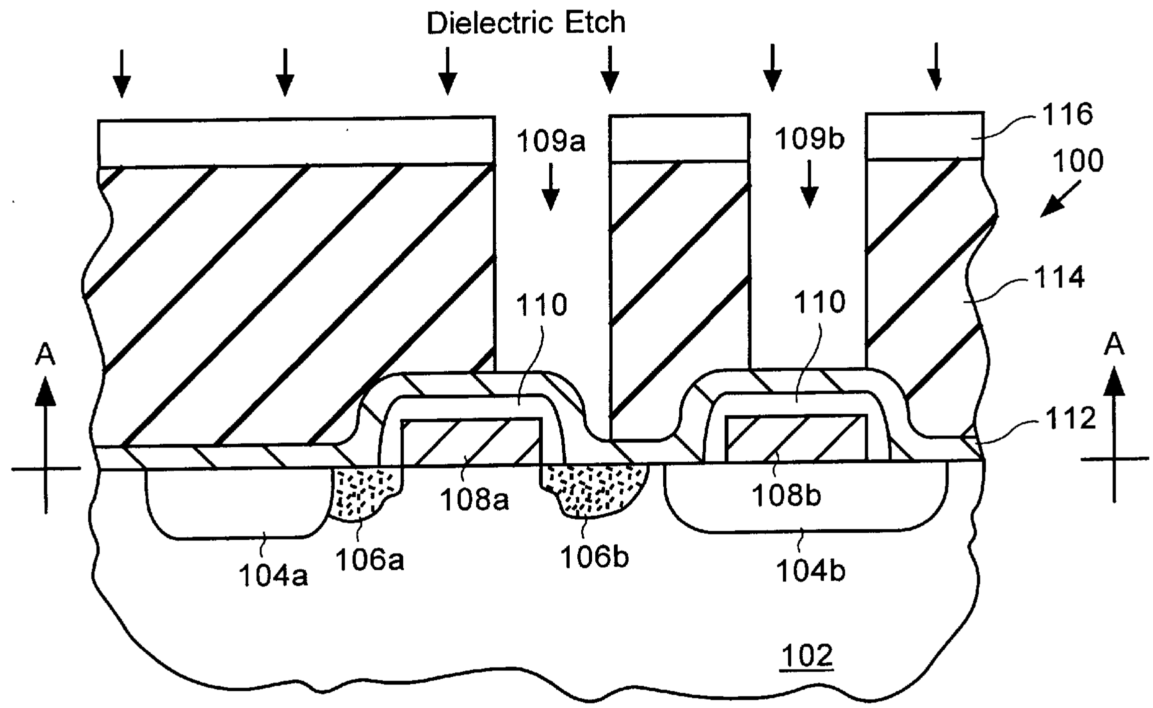
FIG. 1A shows a cross sectional view of a semiconductor substrate having several fabricated layers illustrating a exemplary self-aligned contact (SAC) in accordance with a conventional semiconductor fabrication technique.
Figure 1C:
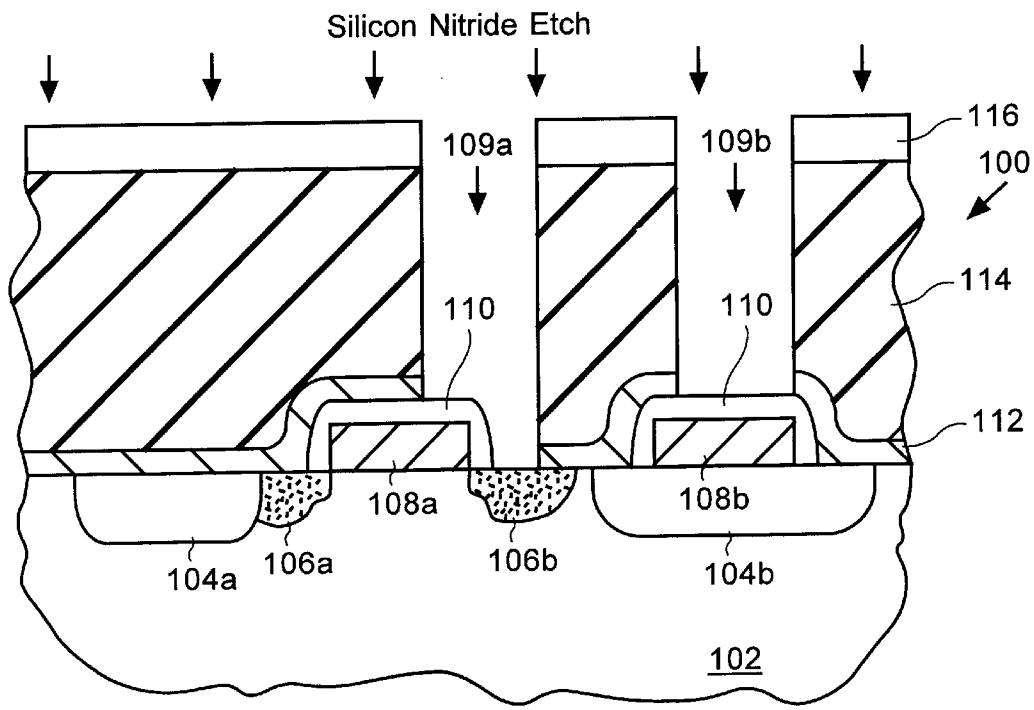
FIG. 1C shows the cross sectional view of FIG. 1A after a silicon nitride etch is performed.
Figure 1B:
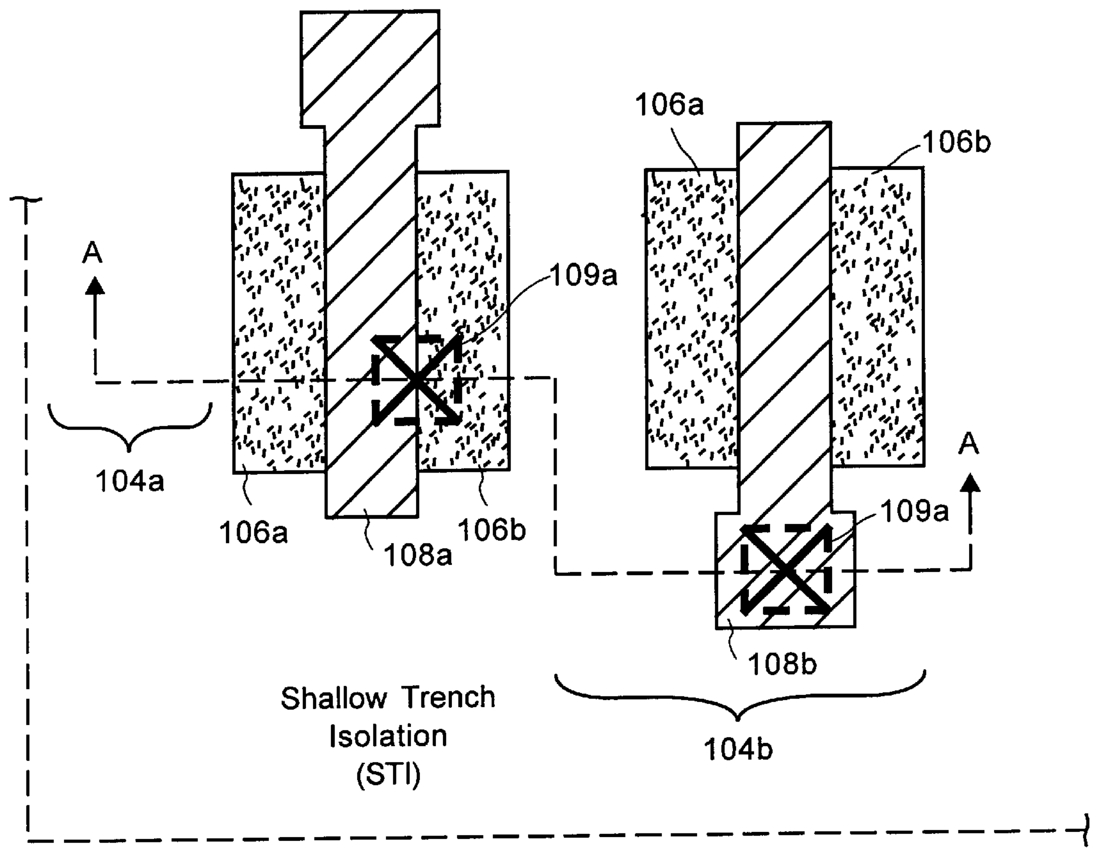
FIG. 1B shows a top view of the cross sectional view of FIG. 1A.
Figure 1D:
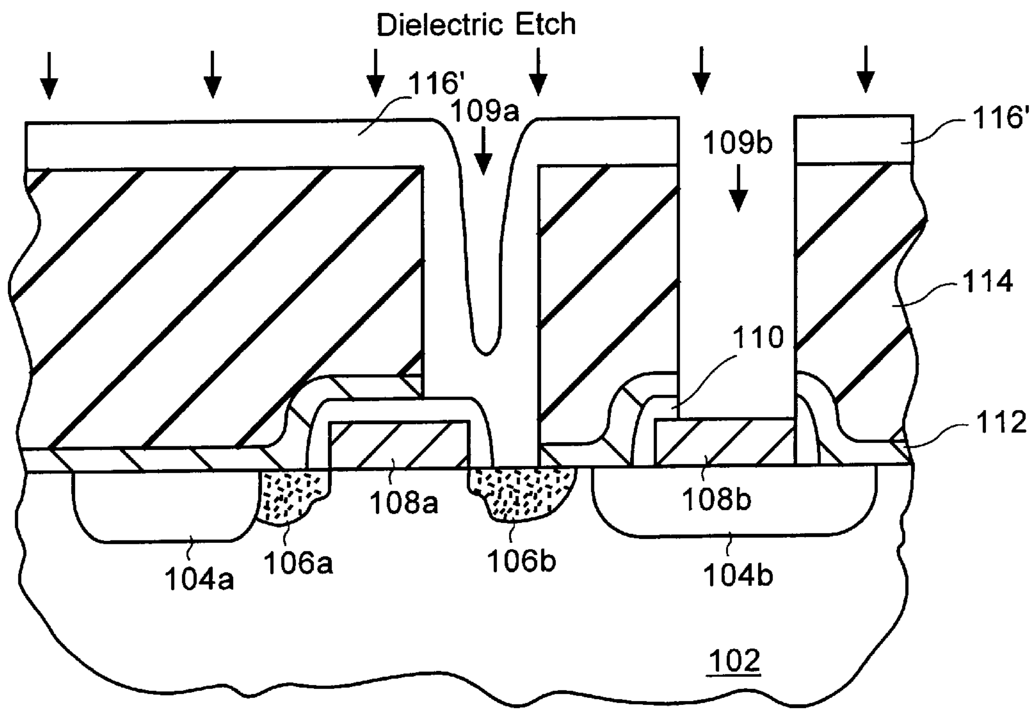
FIG. 1D shows the cross sectional view of FIG. 1C after a dielectric etch is performed.
Figure 1E:
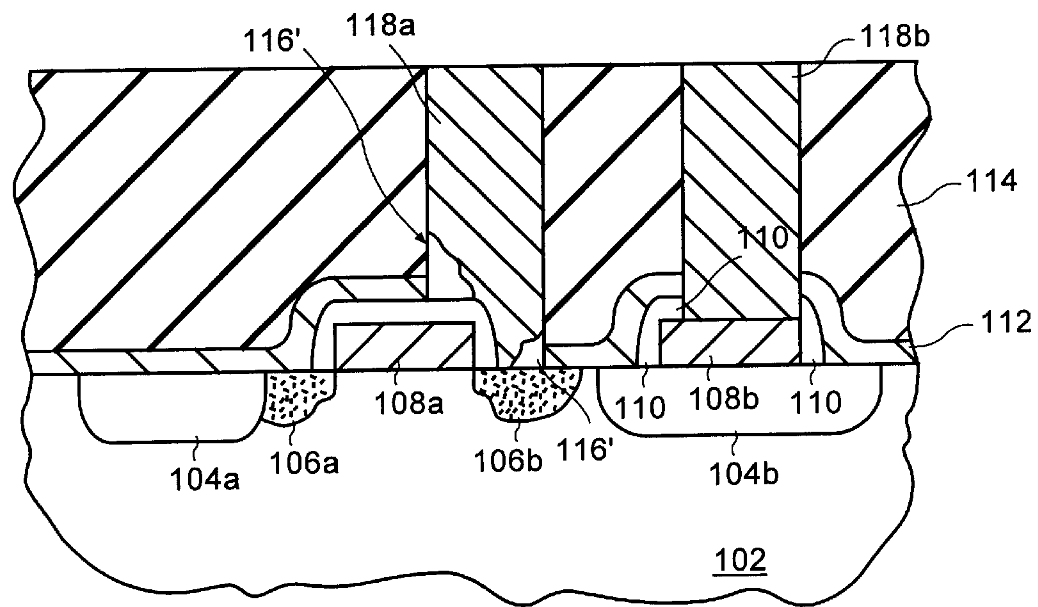
FIG. 1E shows the cross sectional view of FIG. 1D after a conductive fill operation is performed and photoresist residues are trapped within selected via holes.

The transistor 201*a* is shown having diffusion regions 206*a* and 206*b* which are used to define the source and drain regions of the transistor device. From this cross sectional view, the diffusion regions of the transistor 201*b* are not shown because the cross section of transistor 201*b* is being viewed from the polysilicon gate contact region as shown in FIG. 1B above. Each of the transistors 201*a* and 201*b* also have a gate oxide 207 and respective polysilicon gates 208*a* and 208*b*. Once the polysilicon gates 208*a* and 208*b* are formed using conventional deposition and photolithography pattering and etching techniques, an oxide material 210 is deposited over the top of the semiconductor wafer.

Once the deposition of the oxide material is complete, an oxide etching operation is performed until a layer of oxide material 210 remains over the polysilicon gates 208*a* and 208*b*. The oxide material that remains along the sidewalls of the polysilicon gates will therefore define well known oxide spacers. The oxide material that remains over the top portion of the polysilicon gates 208*a* and 208*b* is commonly used to facilitate the fabrication of self-aligned contacts (SAC). In this embodiment, the oxide material 210 is preferably deposited over the polysilicon gates to a thickness ranging between about 500 angstroms and about 1,500 angstroms, and more preferably between about 750 angstroms and about 1,300 angstroms, and most preferably about 1,000 angstroms.

Figure 3A:
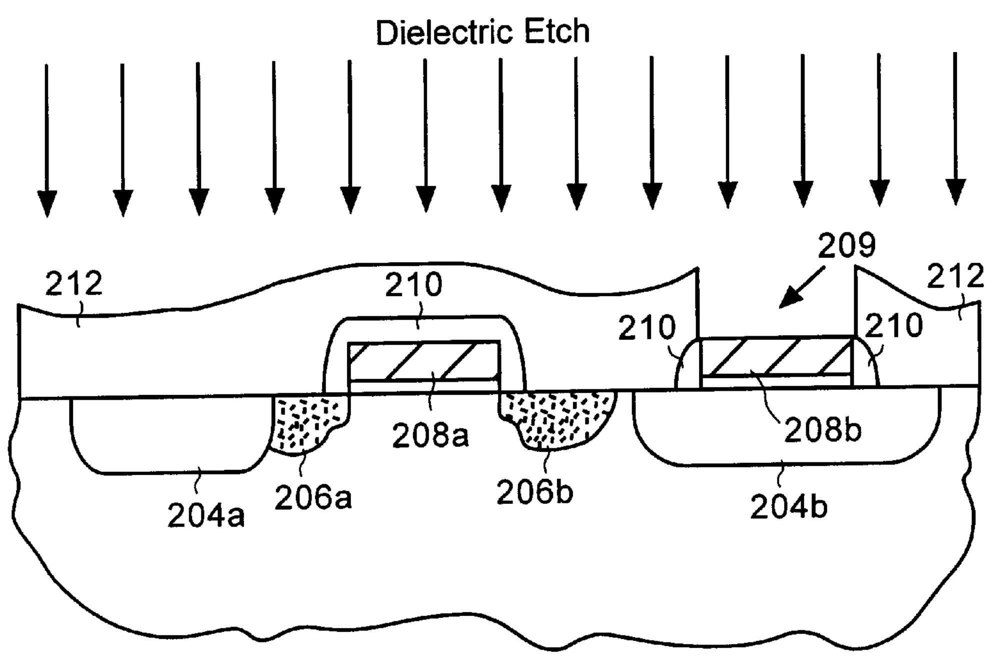
FIG. 3A shows the cross section view of FIG. 2 after a photoresist mask defining windows over selected gate electrodes is defined in accordance with one embodiment of the present invention.

After the oxide material 210 is formed over the polysilicon gate structures, a photoresist mask 212 is spin-coated over the top of the semiconductor substrate 200 as shown in FIG. 3A. Subsequent to the photoresist material 212 being spin-coated, the photoresist material is subjected to a photolithography patterning operation. Preferably, the photolithography reticle mask will have a pattern that defines windows that are configured to identify contact locations 209 over the polysilicon gates throughout a semiconductor device. The windows are preferably sized about 30% larger than a contact diameter, in order to avoid making this masking operation a critical masking operation. Thus, the sizing up provides an additional tolerance in case mask misalignments occur.

The contact locations 209 will therefore lie over shallow trench isolation regions (i.e., STI 204*b*). As a result, a path is made in the photoresist layer 212 (after development) over all of the contact locations 209. Once the photoresist material 212 has been patterned to expose the oxide material 210 over the polysilicon gate 208*b*, a dielectric etch is performed as shown in FIG. 3A.

Figure 4:
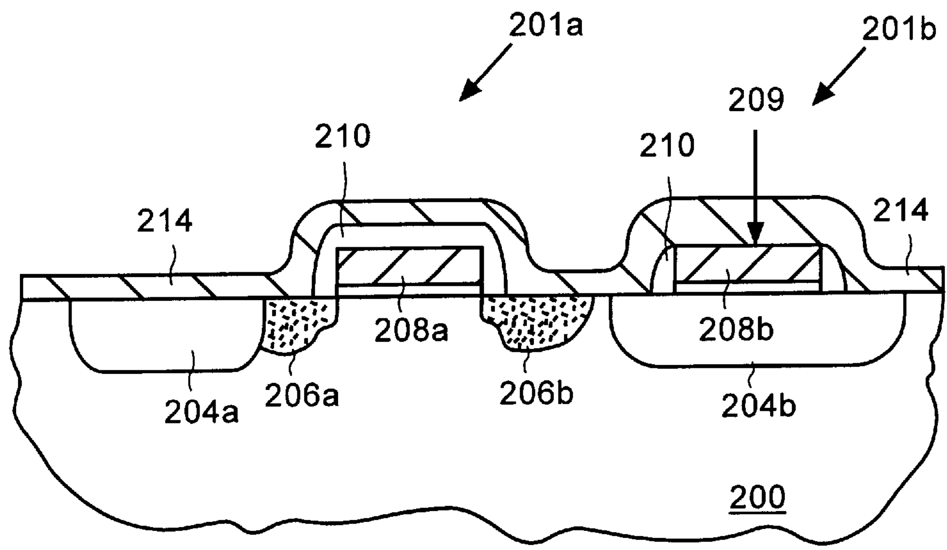
FIG. 4 shows the cross section view of FIG. 3A after the photoresist mask is stripped and a silicon nitride layer is deposited in accordance with one embodiment of the present invention.

Before a silicon nitride layer 214 is deposited over the semiconductor substrate 200 as shown in FIG. 4, the photoresist material 212 is stripped. In one embodiment, the silicon nitride layer 214 is deposited to a thickness ranging between about 500 angstroms and about 2,000 angstroms, and more preferably between about 750 angstroms and about 1,300 angstroms, and most preferably about 1,000 angstroms. As shown, the silicon nitride layer 214 will now be in contact with the oxide material 210 over the polysilicon gate 208*a* and in direct contact with the polysilicon gate 208*b*.

Figure 5:
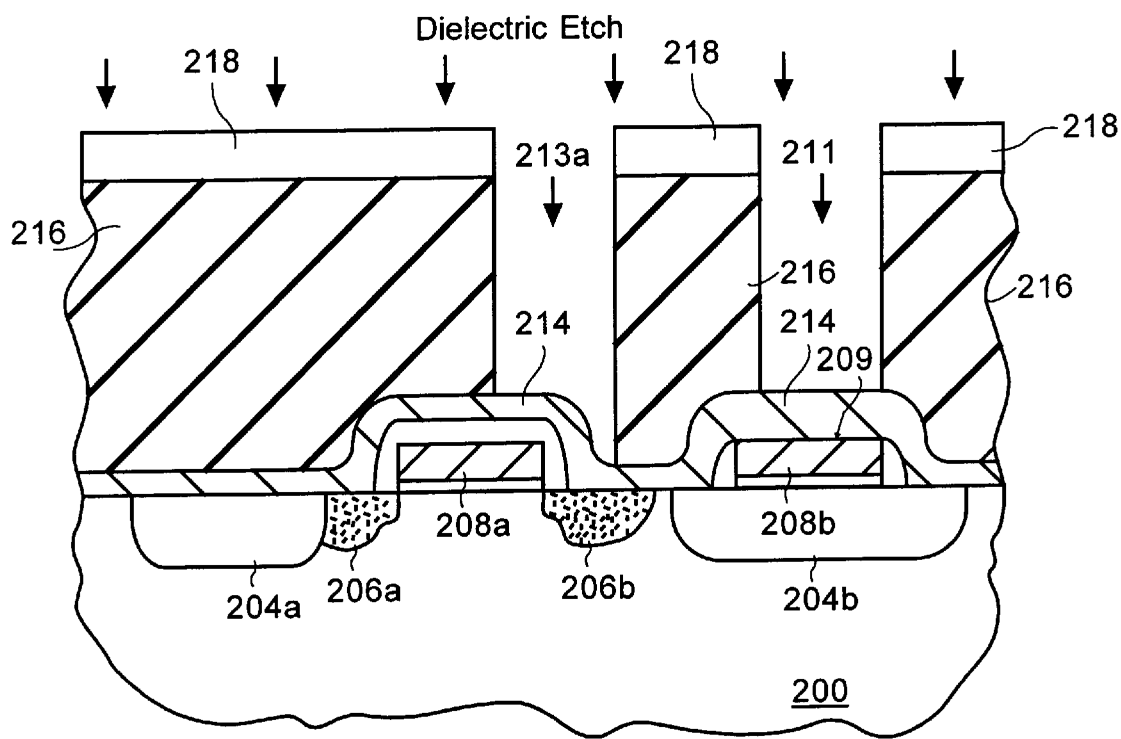
FIG. 5 shows a cross sectional view of the semiconductor substrate after additional fabrication operations are completed in accordance with one embodiment of the present invention.

FIG. 5 shows a cross sectional view of the semiconductor substrate 200 after additional fabrication operations are completed in accordance with one embodiment of the present invention. In this embodiment, a dielectric layer 216 is deposited over the semiconductor substrate 200 to a thickness ranging between about 5,000 angstroms and about 15,000 angstroms, and more preferably between about 7,000 angstroms and about 10,000 angstroms, and most preferably about 8,000 angstroms. After the dielectric layer 216 is deposited to the desired thickness, a photoresist mask 218 is formed over the dielectric layer 216 in order to define the locations where via holes will be etched. In one embodiment, the etching through the dielectric layer 216 will preferably be performed using the etching chemistries and conditions illustrated in table A below.

TABLE A

| Dielectric ($SiO_2$) Etch Chemistry | | | $Ar/CF_4/CO/C_4F_8$ | | | | | |
|---|---|---|---|---|---|---|---|---|
| | Top Power watts | Bottom Power watts | Flow Rates SCCM | | | | Pressure mTorr | (He) backside pressure Torr |
| Preferred Range | 400–1200 | 500–1500 | Ar 150–500 | $CF_4$ 1–8 | CO 50–300 | $C_4F_5$ 1–8 | 25–150 | 5–30 |
| More Preferred Range | 600–1000 | 800–1200 | Ar 250–350 | $CF_4$ 1–5 | CO 100–200 | $C_4F_8$ 1–5 | 40–80 | 10–20 |
| Most Preferred | 800 | 1000 | Ar 300 | $CF_4$ 2 | CO 150 | $C_4F_8$ 2 | 60 | 15 |

Figure 3B:
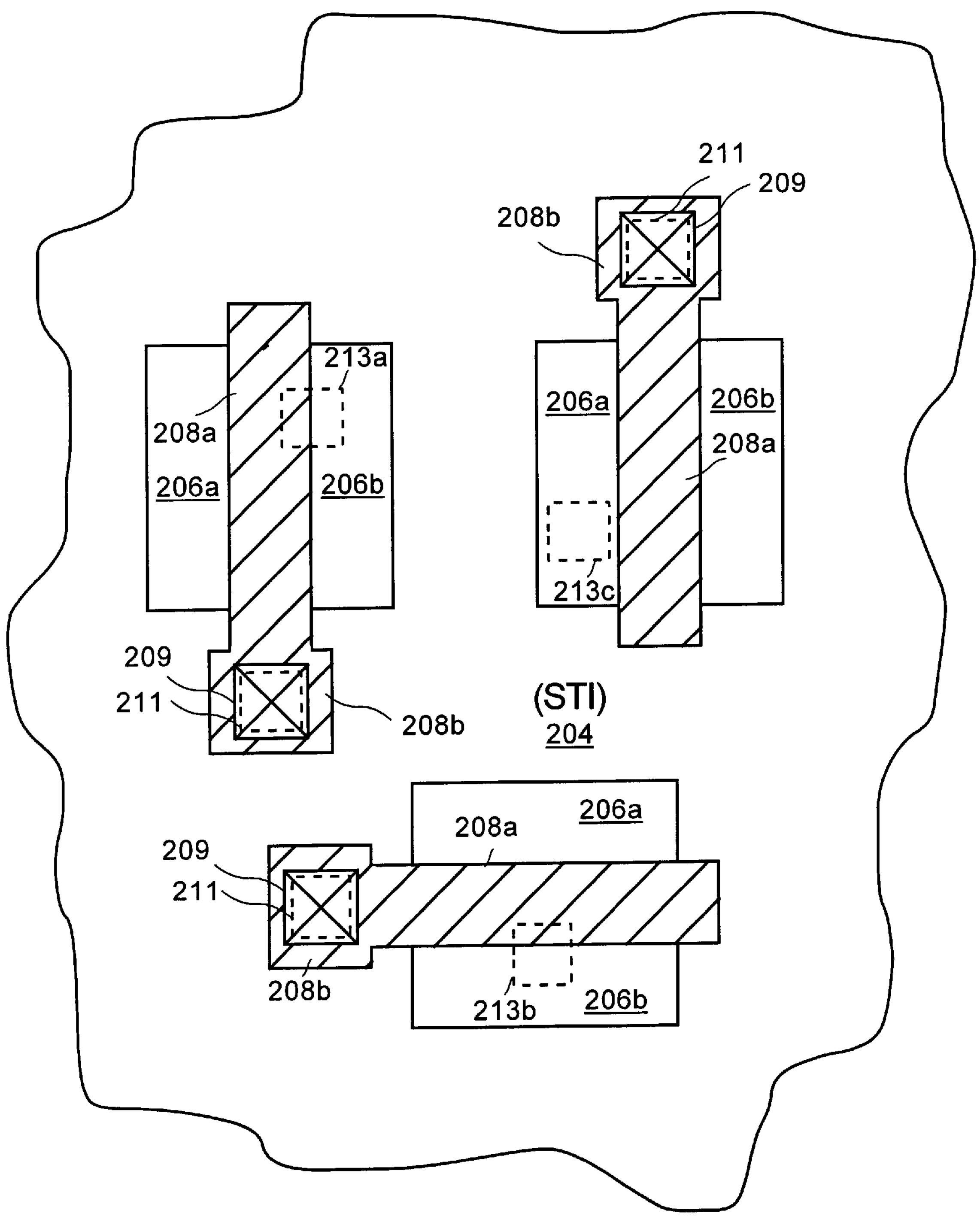
FIG. 3B shows an exemplary top view of several transistor structures having contact locations defined down to selected gate electrodes and selected diffusion regions in accordance with one embodiment of the present invention.

The etching through the dielectric layer 216 will preferably include etching the via holes 213*a* and 211 for contacts made to the diffusion region 206*b* and the polysilicon gate 208*b*. The via hole 211 is preferably defined over the contact location 209 as shown in FIG. 3B, while the via hole 213*a* is defined over the diffusion region 206*b*. FIG. 3B also shows that all other via holes 211 down to contact locations 209 over different transistor gates 208*b*/208*a* will be made at the same time the via holes 213*a*, 213*b*, and 213*c* are made over selected diffusion regions.

Figure 6:
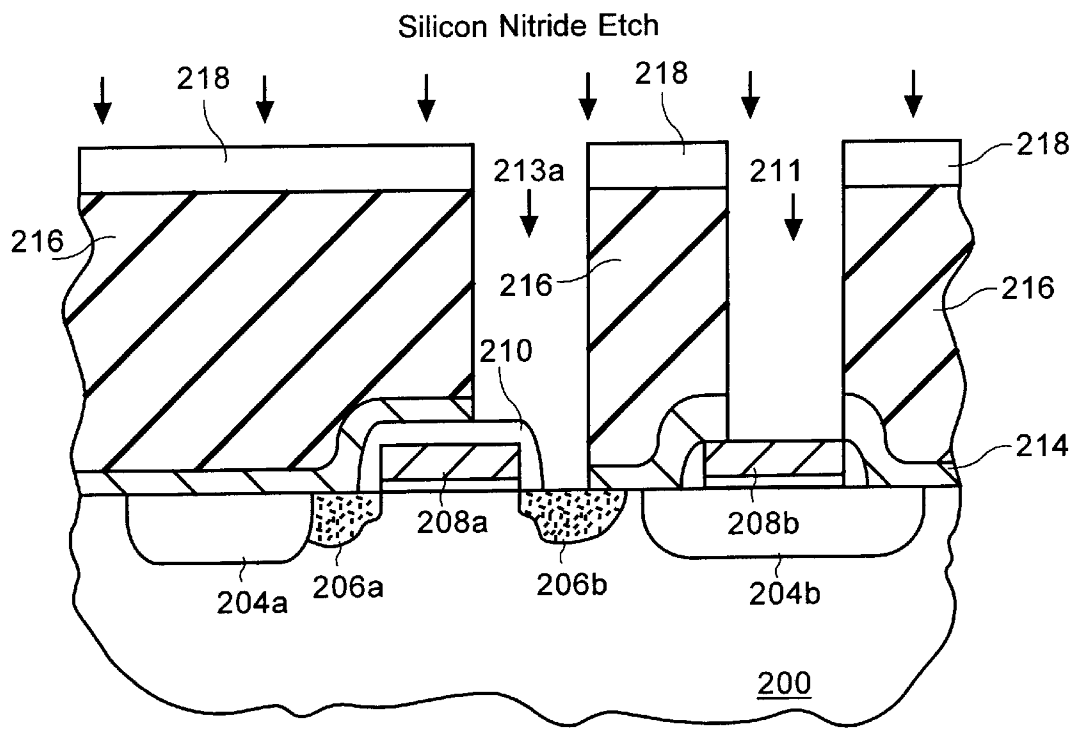
FIG. 6 shows a cross sectional view of FIG. 5 after a silicon nitride etch is performed in accordance with one embodiment of the present invention.

After the via holes for both diffusion regions and polysilicon gate contacts are made through the dielectric layer 216, a second etch operation is performed to remove the silicon nitride layer 214 in the respective via holes as shown in FIG. 6. In this embodiment, the silicon nitride etch chemistry will preferably be well suited to remove substantially all of the silicon nitride layer 214 that lies over the oxide material 210 in via hole 213*a*, and the silicon nitride material 214 that lies over the polysilicon gate 208*b* in via hole 211. In this preferred embodiment, the etching through the silicon nitride layer 214 will preferably be performed using the etching chemistries and conditions illustrated in table B below.

Figure 7:
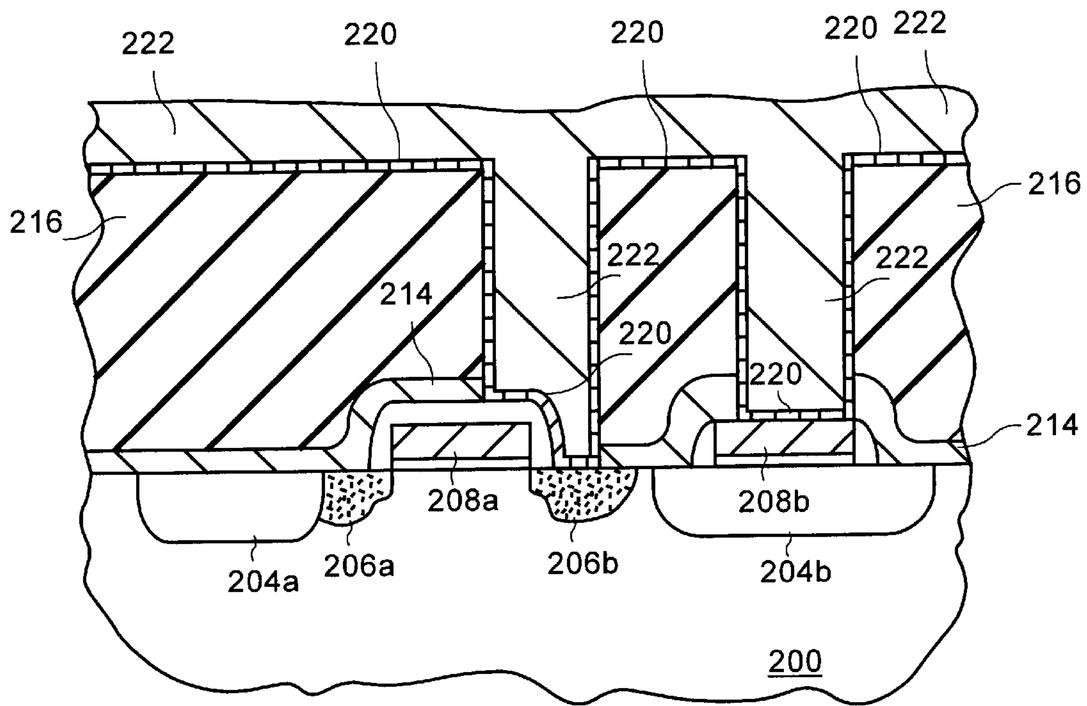
FIG. 7 shows the semiconductor substrate cross section of FIG. 6 after the photoresist mask has been removed and a metallization fill process has been performed in accordance with one embodiment of the present invention.

FIG. 7 shows the semiconductor substrate cross section of FIG. 6 after the photoresist mask 218 has been removed and a metallization fill process has been performed in accordance with one embodiment of the present invention. In this embodiment, a titanium nitride (TiN) barrier layer 220 is preferably deposited over the semiconductor structure in order to deposit a thin film within the via holes. Once the titanium nitride layer 220 has been deposited, a tungsten deposition is performed to deposit a tungsten layer 222 to fill the via holes throughout the semiconductor substrate. After the via holes have been sufficiently filled with the tungsten material 222, a tungsten etch-back operation is performed to remove the excess tungsten material and the titanium nitride material 220 that lies over the dielectric layer 216. Alternatively, the semiconductor wafer may be placed through a chemical mechanical polishing (CMP) operation in order to remove the excess tungsten material and titanium nitride layer 220 that may lie over the dielectric layer 216.

Figure 8:
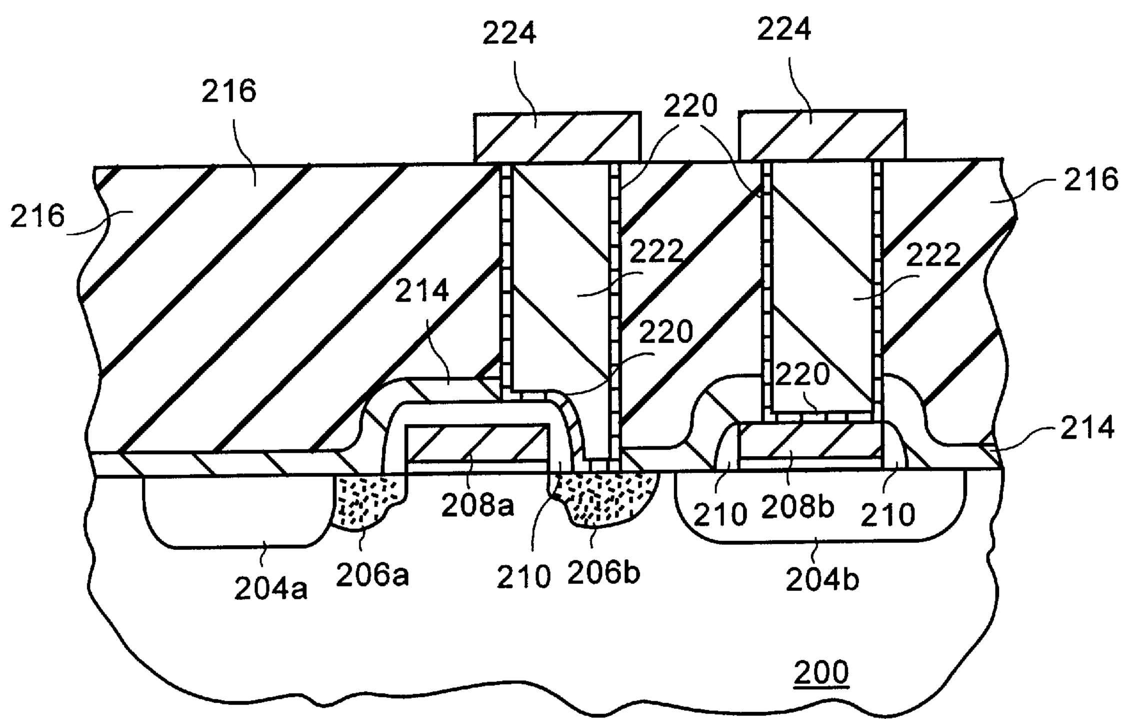
FIG. 8 shows the cross sectional view of the semiconductor substrate after patterned metallization lines have been formed over the dielectric layer and made to selectively contact the conductive vias that interconnect the polysilicon gates and the diffusion regions.

FIG. 8 shows the cross sectional view of the semiconductor substrate 200 after patterned metallization lines 224 have been formed over the dielectric layer 216 and made to selectively contact the conductive vias that interconnect the polysilicon gates 208*b* and the diffusion regions 206*b*. At

TABLE B

| Silicon Nitride Etch Chemistry | | | $CHF_3/O_2$ | | | |
|---|---|---|---|---|---|---|
| | Top Power watts | Bottom Power watts | Flow Rates SCCM | | Pressure mTorr | (He) backside pressure Torr |
| Preferred Range | 100–300 | 50–200 | $CHF_3$ 1–20 | $O_2$ 20–100 | 100–300 | 5–20 |
| More Preferred Range | 150–250 | 75–125 | $CHF_3$ 2–10 | $O_2$ 30–60 | 150–250 | 7–13 |
| Most Preferred | 200 | 100 | $CHF_3$ 5 | $O_2$ 45 | 200 | 10 |

At this point, it should be evident that via holes made down to the diffusion regions and to polysilicon gates may be made at the same time without requiring separate and duplicative processing operations to form the via holes down to diffusion regions, and then performing all of the same process steps again to make the via holes down to the selected polysilicon gate contact locations. In addition, it should also be evident that there is no need to spin-coat photoresist materials into via holes where they may be trapped and cause excessive resistance through the finished conductive contacts, reduced reliability, and losses in yield.

this point, highly reliable interconnect conductive vias are made down to selected contact locations to the polysilicon gates and to the selected diffusion regions throughout the semiconductor substrate without the risk of leaving contaminating photoresist material within the via holes. In addition, it should be noted that the simultaneous formation of the via holes throughout the semiconductor device will eliminate the repetitive prior art process that requires individual formation of diffusion region contacts and polysilicon gate contacts.

Figure 9:
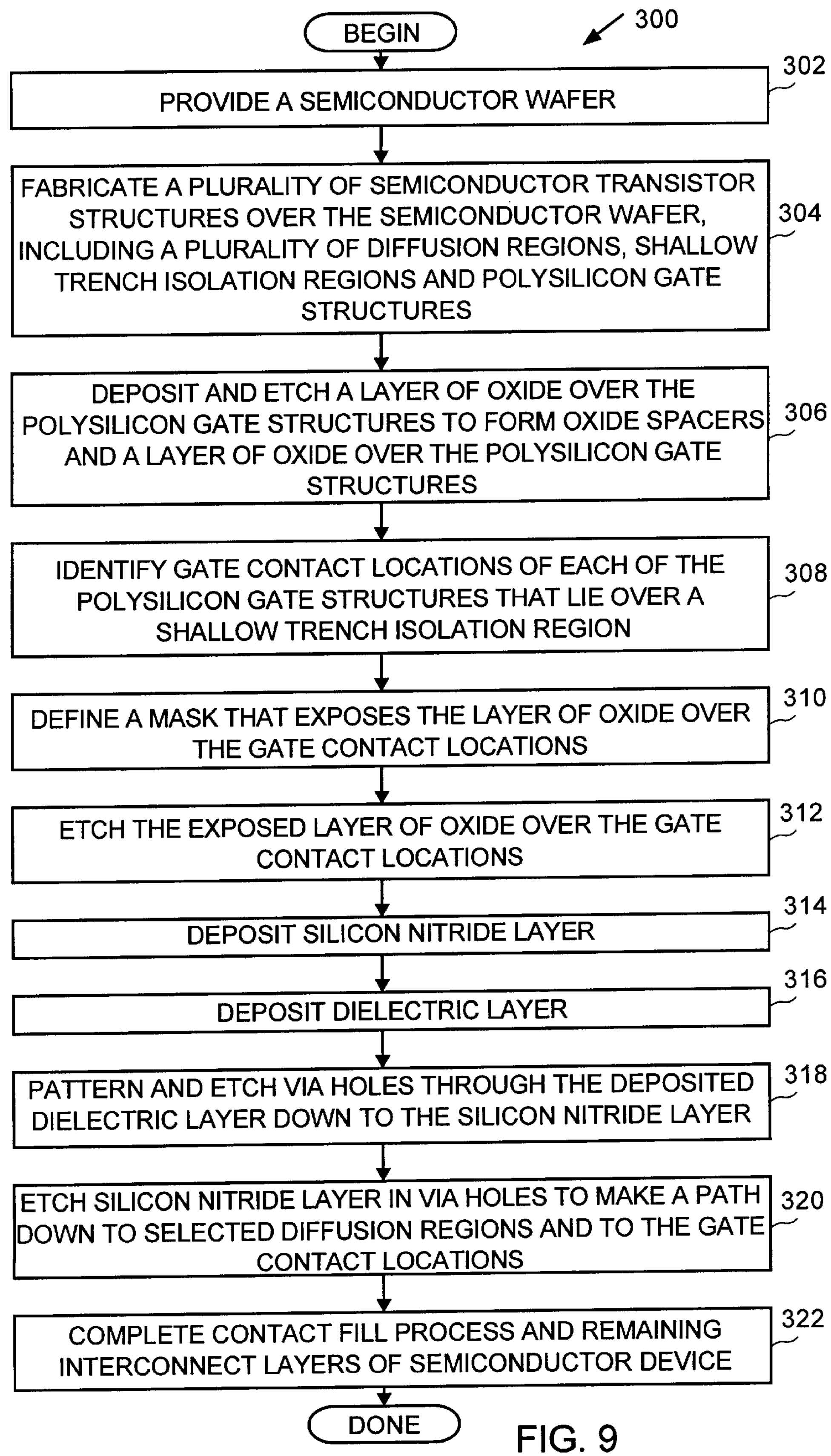
FIG. 9 shows a flowchart diagram in accordance with one embodiment of the present invention.

FIG. 9 shows a flowchart diagram 300 in accordance with one embodiment of the present invention. The method 300 begins at an operation 302 where a semiconductor wafer is provided. Once the semiconductor wafer has been provided, the method proceeds to an operation 304. In operation 304, a plurality of semiconductor transistor structures are fabricated throughout the semiconductor wafer. In this embodiment, each of the semiconductor transistor structures will include a pair of diffusion regions, polysilicon gate structures, and shallow trench isolation regions.

The method now proceeds to an operation 306 where a deposition of an oxide material is performed to cover the entire semiconductor wafer. After the deposition of the oxide is complete, an etching operation is performed until oxide spacers are created around the sidewalls of the polysilicon gate structures and a layer of oxide remains over the top surface of the polysilicon gate structures (i.e., oxide material 210). Once the deposition and etching operation is performed in operation 306, the method proceeds to an operation 308 where gate contact locations over each of the transistor polysilicon gate structures that lie over shallow trench isolation regions are identified.

For example, the gate contact locations may be contact locations 209 as shown in FIG. 3B, which lie over the shallow trench isolation regions 204. Once these gate contact locations are identified, the method will proceed to an operation 310 where a photoresist mask is defined to expose the layer of oxide over the gate contact locations. Next, the method will proceed to an operation 312 where the exposed layer of oxide over the gate contact locations is etched. After the exposed layer of oxide over the gate contact location is etched in operation 312, the method will proceed to an operation 314 where a silicon nitride layer is deposited over the semiconductor substrate wafer surface (including fabricated devices). The method now proceeds to an operation 316 where a dielectric layer is deposited over the entire surface of the semiconductor wafer.

After the dielectric deposition, the method proceeds to an operation 318 where via holes are patterned and etched through the deposited dielectric layer down to the silicon nitride layer, both over the regions where contacts to diffusion regions are desired and where contact locations over the polysilicon gates are desired. Once the via holes are etched down to the silicon nitride layer in operation 318, the method will proceed to an operation 320 where each silicon nitride layer in the via holes is etched to make a path down to the selected diffusion regions and the gate contact locations at the same time.

Now, the via holes for both diffusion contacts and polysilicon gate contacts are complete and a suitable contact fill process may be performed (e.g. tungsten plugs, aluminum fill, etc.). Therefore, the method will now proceed to an operation 322 where the contact fill process is complete and the remaining interconnect layers of the semiconductor device are formed. At this point, the method will be done and other suitable process fabrication operations and packaging operations may be performed to complete the integrated circuit device.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for manufacturing reliable conductive contacts in semiconductor devices fabricated throughout a semiconductor wafer, the semiconductor devices having a multiplicity of transistor devices, each of the transistor devices having a pair of diffusion regions and a polysilicon gate structure; the method comprising:

forming an oxide layer over a top surface and sidewalls of the polysilicon gate structure of each of the transistor devices;

forming a photoresist mask that exposes gate contact locations over the polysilicon gate structure of each of the transistor devices, the gate contact locations being defined over shallow trench isolation regions;

etching the oxide layer over the top surface of the polysilicon gate structure of each of the transistor devices, the etching being configured to remove the oxide layer that is exposed by the photoresist mask;

depositing a silicon nitride layer over the transistor devices that are defined throughout the semiconductor wafer;

depositing a dielectric layer over the silicon nitride layer; and etching via holes through the dielectric layer and the silicon nitride layer for conductive contacts down to selected ones of the pair of diffusion regions and the polysilicon gate structure of selected transistor devices.

2. A method for manufacturing reliable conductive contacts in semiconductor devices fabricated throughout a semiconductor wafer as recited in claim 1, wherein the operation of etching via holes throughout the dielectric layer and the silicon nitride layer further comprises:

etching through the dielectric layer using a first chemistry; and etching through the silicon nitride layer using a second chemistry.

3. A method for manufacturing reliable conductive contacts in semiconductor devices fabricated throughout a semiconductor wafer as recited in claim 2, wherein the first chemistry is a mixture of $Ar/CF_4/CO/C_4F_8$.

4. A method for manufacturing reliable conductive contacts in semiconductor devices fabricated throughout a semiconductor wafer as recited in claim 3, wherein the etching of the first chemistry mixture of $Ar/CF_4/CO/C_4F_8$ is performed in a chamber having a pressure of between about 40 mTorr and 80 mTorr, and a He backside pressure of between about 10 Torr and about 20 Torr.

5. A method for manufacturing reliable conductive contacts in semiconductor devices fabricated throughout a semiconductor wafer as recited in claim 2, wherein the second chemistry is a mixture of $CHF_3/O_2$.

6. A method for manufacturing reliable conductive contacts in semiconductor devices fabricated throughout a semiconductor wafer as recited in claim 5, wherein the etching of the second chemistry mixture of $CHF_3/O_2$ is performed in a chamber having a pressure of between about 150 mTorr and about 250 mTorr, and a He backside pressure of between about 7 Torr and about 13 Torr.

7. A method for manufacturing reliable conductive contacts in semiconductor devices fabricated throughout a semiconductor wafer as recited in claim 1, wherein the exposed gate contact locations of the photoresist mask are sized up by about 30% over a gate contact diameter.

8. A method for manufacturing reliable conductive contacts in semiconductor devices fabricated throughout a semiconductor wafer as recited in claim 1, further comprising:

stripping the photoresist mask before depositing the dielectric layer over the transistor devices.

9. A method for manufacturing reliable conductive contacts in semiconductor devices fabricated throughout a semiconductor wafer as recited in claim 8, further comprising:

depositing a barrier layer throughout the semiconductor wafer and inner surfaces of the via holes.

10. A method for manufacturing reliable conductive contacts in semiconductor devices fabricated throughout a semiconductor wafer as recited in claim 9, further comprising:

depositing a conductive fill material over the barrier layer throughout the semiconductor wafer.

11. A method for manufacturing reliable conductive contacts in semiconductor devices fabricated throughout a semiconductor wafer as recited in claim 10, wherein the barrier layer is a titanium nitride material and the conductive fill material is tungsten.

12. A method for fabricating conductive contacts in a dielectric layer that overlies a semiconductor wafer having diffusion regions, shallow trench isolation regions, and gate structures that have a part overlying the shallow trench isolation regions, comprising:

forming an oxide layer over the gate structures;

forming a photoresist mask over the semiconductor wafer including the oxide layer over the gate structures, the photoresist mask having windows that define an opening over gate contact locations, the gate contact locations being defined substantially over the part of the gate structures that overlie the shallow trench isolation regions;

etching the oxide layer over the gate structures through the windows to define exposed gate structure regions;

depositing a silicon nitride layer over the semiconductor wafer including the oxide layer over the gate structures and the exposed gate structure regions;

depositing a dielectric layer over the deposited silicon nitride layer; and etching via holes through the dielectric layer and the silicon nitride layer to define conductive contact vias to both the exposed gate structure regions and diffusion regions.

13. A method for fabricating conductive contacts as recited in claim 12, wherein the etching via holes further comprises:

etching through the dielectric layer using a first chemistry; and etching through the silicon nitride layer using a second chemistry.

14. A method for fabricating conductive contacts as recited in claim 13, wherein the first chemistry comprises a mixture of $Ar/CF_4/CO/C_4F_8$.

15. A method for fabricating conductive contacts as recited in claim 13, wherein the second chemistry comprises a mixture of $CHF_3/O_2$.

16. A method for fabricating conductive contacts as recited in claim 12, further comprising:

forming a via hole photoresist mask over the dielectric layer before etching the via holes.

17. A method for fabricating conductive contacts as recited in claim 12, further comprising:

stripping the photoresist mask before depositing the silicon nitride layer.

18. A method for fabricating conductive contacts as recited in claim 12, further comprising:

filling the via holes with a conductive material.

19. A method for fabricating conductive contacts as recited in claim 18, wherein the conductive material comprises:

a barrier layer; and a tungsten fill.

20. A method of making an integrated circuit device having reliable conductive contacts formed in accordance with a self-aligned contact (SAC) process, the integrated circuit device being fabricated from a semiconductor wafer having diffusion regions, shallow trench isolation regions, and gate structures that have a part overlying the shallow trench isolation regions, comprising:

forming an oxide layer over the gate structures;

forming a photoresist mask over the semiconductor wafer including the oxide layer over the gate structures, the photoresist mask having windows that define an opening over gate contact locations, the gate contact locations being defined substantially over the part of the gate structures that overlie the shallow trench isolation regions;

etching the oxide layer over the gate structures through the windows to define exposed gate structure regions;

depositing a plurality of layers over the semiconductor wafer including the oxide layer over the gate structures and the exposed gate structure regions; and etching via holes through the plurality of layers to define conductive contact vias to both the exposed gate structure regions and diffusion regions.

21. A method of making an integrated circuit device having reliable conductive contacts formed in accordance with a self-aligned contact (SAC) process as recited in claim 20, where in the depositing a plurality of layers further comprises:

depositing a silicon nitride layer over the semiconductor wafer including the oxide layer over the gate structures and the exposed gate structure regions; and depositing a dielectric layer over the deposited silicon nitride layer.

22. A method of making an integrated circuit device having reliable conductive contacts formed in accordance with a self-aligned contact (SAC) process as recited in claim 21, wherein the etching via holes further comprises:

etching through the dielectric layer using a first chemistry; and etching through the silicon nitride layer using a second chemistry.

23. A method of making an integrated circuit device having reliable conductive contacts formed in accordance with a self-aligned contact (SAC) process as recited in claim 22, wherein the first chemistry comprises a mixture of $Ar/CF_4/CO/C_4F_8$.

24. A method of making an integrated circuit device having reliable conductive contacts formed in accordance with a self-aligned contact (SAC) process as recited in claim 22, wherein the second chemistry comprises a mixture of $CHF_3/O_2$.

25. A method of making an integrated circuit device having reliable conductive contacts formed in accordance with a self-aligned contact (SAC) process as recited in claim 20, further comprising:

filling the via holes with a conductive material.

26. A method of making an integrated circuit device having reliable conductive contacts formed in accordance with a self-aligned contact (SAC) process as recited in claim 25, wherein the conductive material comprises:

a barrier layer; and a tungsten fill.

* * * * *